United States Patent [19]

Wall

[11] 4,258,378

[45] Mar. 24, 1981

[54] ELECTRICALLY ALTERABLE FLOATING GATE MEMORY WITH SELF-ALIGNED LOW-THRESHOLD SERIES ENHANCEMENT TRANSISTOR

[75] Inventor: Lawrence S. Wall, Houston, Tex.

[73] Assignee: Texas Instruments Incorporated, Dallas, Tex.

[21] Appl. No.: 909,902

[22] Filed: May 26, 1978

[51] Int. Cl.³ .......................................... H01L 27/02
[52] U.S. Cl. ..................................... 357/41; 357/45; 357/46; 357/50; 357/51; 357/59; 357/91
[58] Field of Search ...................... 357/41, 45, 46, 50, 357/51, 59, 91

[56] References Cited

U.S. PATENT DOCUMENTS

| | | | |
|---|---|---|---|
| 4,084,108 | 4/1978 | Fujimoto | 357/41 |
| 4,119,995 | 10/1978 | Simko | 357/41 |

Primary Examiner—Edward J. Wojciechowicz
Attorney, Agent, or Firm—John G. Graham

[57] ABSTRACT

An N-channel, double level poly, MOS read only memory or ROM array is electrically programmable by floating gates, and electrically erased power voltages applied to the source, drain, control gate and substrate. The floating gate discharges through the insulator between the floating gate and the control gate, i.e., between first and second level polysilicon. An enhancement mode transistor in series with the floating gate device in each cell provides an improved voltage window for deprogramming by allowing the transistor created by the floating gate to go into the depletion mode. The threshold of this series enhancement transistor is lowered by an implant step in the process which is self-aligning.

11 Claims, 34 Drawing Figures

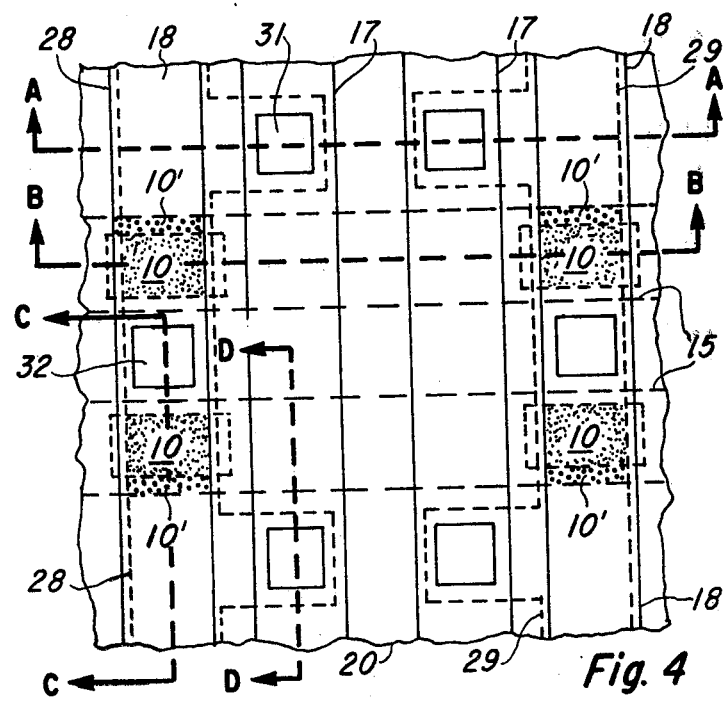
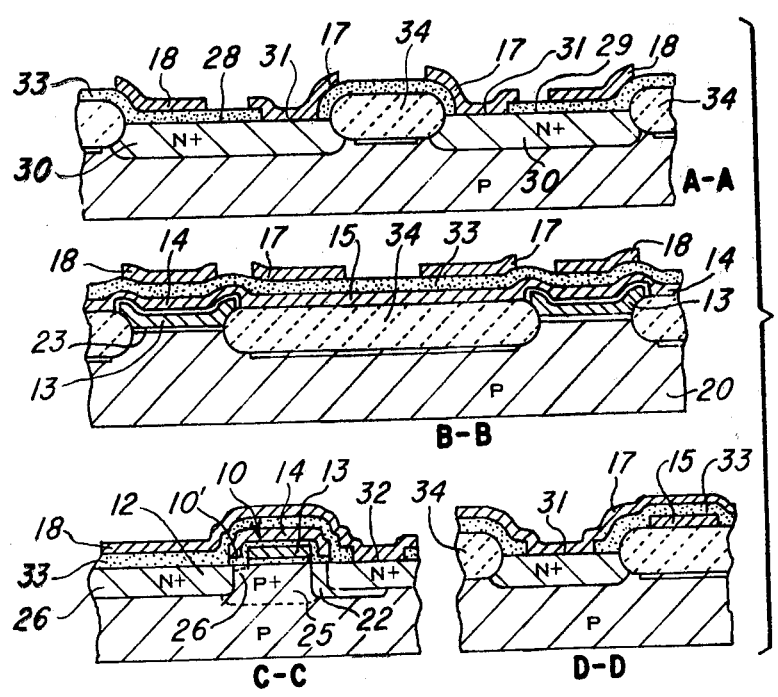

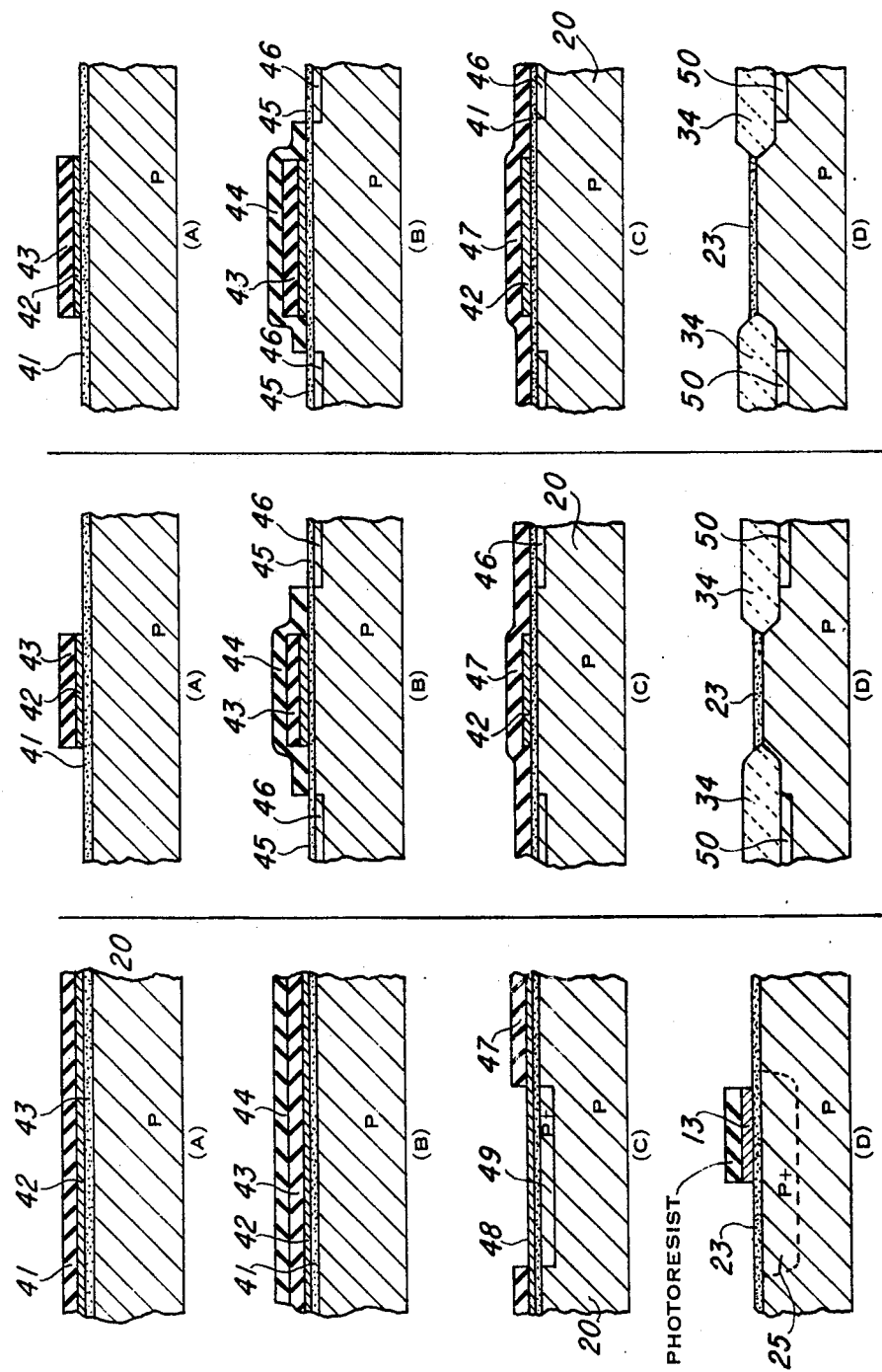

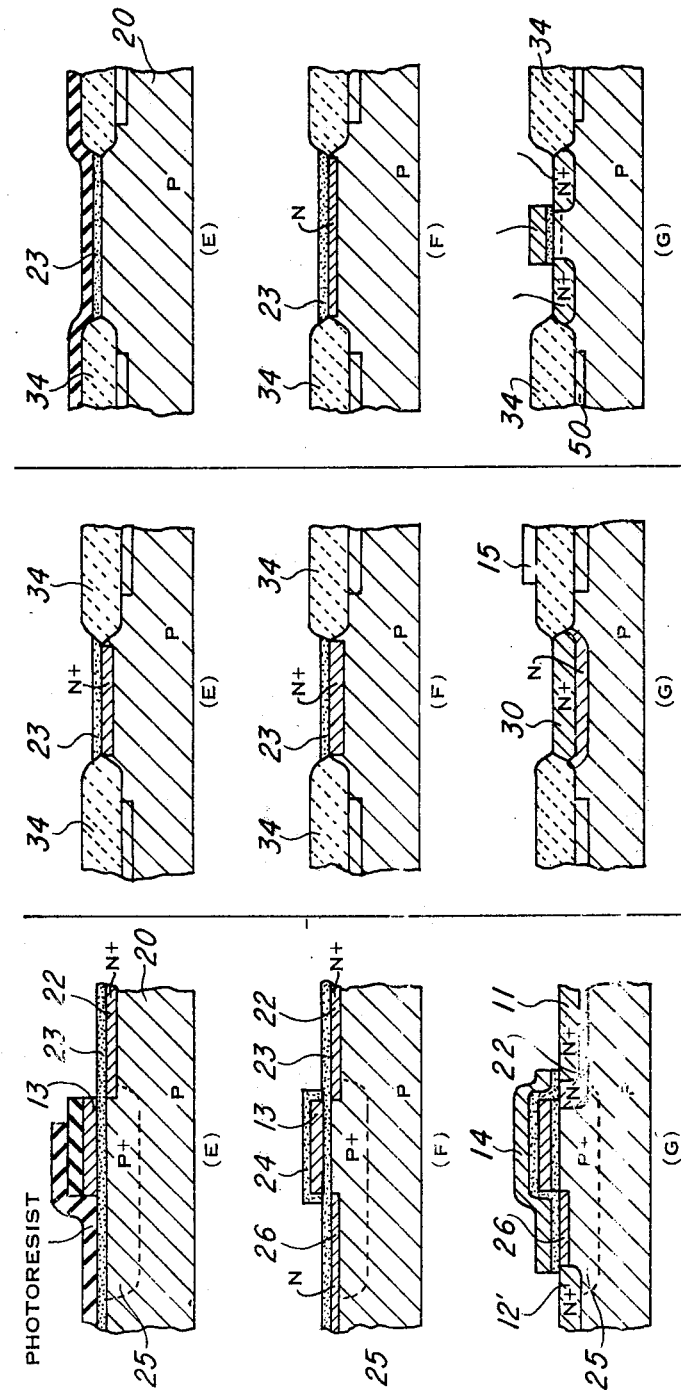

ELECTRICALLY ALTERABLE FLOATING GATE MEMORY WITH SELF-ALIGNED LOW-THRESHOLD SERIES ENHANCEMENT TRANSISTOR

BACKGROUND OF THE INVENTION

This invention relates to semiconductor memory devices and more particularly to an MOS ROM which is electrically erasable and/or electrically programmable.

Nonvolatile semiconductor memory devices are those in which the information stored is not lost when the power supply is removed. The classic example of a nonvolatile memory is the MOS ROM wherein the stored information is permanently fixed upon manufacture by the gate level mask or moat mask as set forth in U.S. Pat. No. 3,541,543, assigned to Texas Instruments, as widely used in calculators and microprocessor systems to store programs. However, it is preferable to be able to program the ROM devices after manufacture rather than during manufacture, so that no unique masks are required. Various electrically programmable ROM devices have been developed such as that shown in U.S. Pat. No. 3,984,822 which employs a floating gate in a double level polysilicon MOS ROM; the floating gate is charged by injection of electrons from the channel, and remains charged even when no power supplies are present. Other devices of this type have employed charge storage on a nitride-oxide interface. Even though the devices are electrically programmable, some are not electrically alterable or deprogrammable (except by exposing the semiconductor chip to ultraviolet light, for example). Electrically alterable ROM's have been developed as set forth in U.S. Pat. Nos. 3,881,180, issued Apr. 29, 1975, and 3,882,469, issued May 6, 1975, as well as application Ser. No. 644,982, filed Dec. 29, 1975, all by M. W. Gosney and assigned to Texas Instruments; the Gosney devices are floating gate cells with dual injection (both holes and elctrons) so that the gates may be charged or discharged. Prior cells have exhibited some undesirable characteristic such as large cell size, process incompatible with standard techniques, high voltages needed for programming, low yields due to close parametric dependency of critical voltage levels, etc.

In copending application Ser. No. 754,207, filed Dec. 27, 1976, by David J. McElroy, assigned to Texas Instruments, an electrically erasable floating gate memory device is described which employs a series enhancement transistor to eliminate the undesirable effect of the floating gate cell going into depletion mode when erased; in the McElroy device, constraints on the erase voltages are reduced so yields are increased and the electrical specifications are improved. However, threshold voltage of the series enhancement device will be dictated by the P+ tank doping, for a given gate oxide thickness. For proper programming, the P+ tank must have a surface concentration of 1 to $2 \times 10^{16}$/cc, causing the threshold voltage of the series enhancement device to be +2 to +3 v. with typical gate oxide thickness. Particularly for devices using a single +5 v. supply, it is preferable that the threshold be lower, about +1 or +0.8 v., but at the same time additional masking steps are undersirable as the yield decreases for each mask step added so costs go up.

It is therefore the principal object of the invention to provide an improved electrically programmable and electrically alterable semiconductor memory cell, particularly a cell with improved electrical specifications. Another object is to provide an electrically alterable cell which is of small cell size when formed in a semiconductor integrated circuit. A further object is to provide a process for making electrically alterable memory cells compatible with N-channel silicon gate technology and of high yield and lost cost.

SUMMARY OF THE INVENTION

In accordance with an embodiment of the invention, a floating gate MOS programmable ROM cell is provided which is made by an N-channel, silicon-gate, self-aligned, double level poly process which is compatible with standard processing techniques. The floating gate is formed by the first level polysilicon which is isolated from the second level poly by an insulator. The cells may be electrically altered or deprogrammed through this insulator by applying proper voltages to the sources, drains, gates and substrate. The "window" or range of permissible voltages for operating the cells is widened by providing an enhancement transistor in series with each floating gate cell; these transistors require no additional connections or masks, and so add little to size or cost. The threshold voltage of the series enhancement transistor is lowered compared to the so-called P+ tank, by an implant step which is self-aligning and requires no additional masking.

THE DRAWINGS

The novel features believed characteristic of the invention are set forth in the appended claims. The invention itself, however, as well as other features and advantages thereof, may best be understood by reference to the following detailed description of illustrative embodiments, when read in conjunction with the accompanying drawings, wherein:

FIG. 4 is a plan view of a part of a semiconductor integrated circuit chip containing an array of the cells of FIGS. 1 and 2;

FIGS. 5a to 5d are elevation views in section of the array of FIG. 4, taken along the lines a—a, b—b, c—c and d—d, respectively, in FIG. 4;

FIGS. 6a-6h, 7a-7h and 8a-8h are sectional views showing the cell of FIG. 4 according to the invention at various stages of manufacture.

DETAILED DESCRIPTION OF SPECIFIC EMBODIMENT

Figure 1:
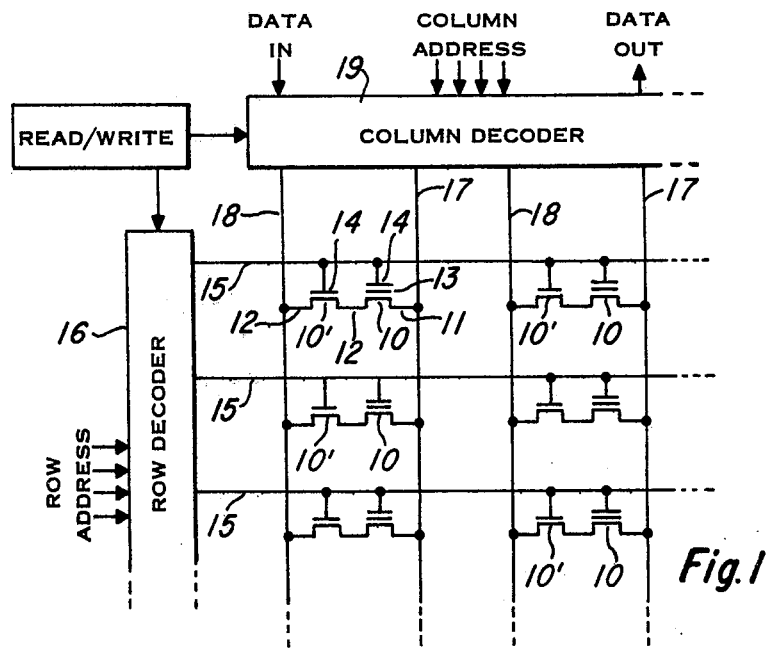
FIG. 1 is an electrical schematic diagram of an array of memory cells according to the invention.

Referring now to FIG. 1, an array of memory cells is shown which may use the invention. Each cell has a floating gate transistor 10 having a source 11, a drain 12, a floating gate 13 and a control gate 14. Each cell also has a series-connected enhancement transistor 10' which has a gate 14' common with the control gate 14 of the transistor 10 in the cell. All of the gates 14 and 14' in a row of cells are connected to a row address line 15, and all of the row address lines 15 are connected to a row decoder 16. All of the source electrodes 11 in a column of cells are connected in common to a source column line 17, and likewise all of the drain electrodes 12 in a column of cells are connected via the source-drain paths of the transistors 10' to a drain column line 18. The source and drain column lines 17 and 18 are connected to a column decoder 19. In a write or program mode, the column decoder functions to apply either a high voltage Vp (about +25 v) or a low voltage (ground or Vss) to each of the source and drain column lines 17 and 18 in each column, in response to a column address and a "0" or "1" data input. For write or program operations, the row decoder 16 functions to apply a high voltage Vp or low voltage Vss to each of the row lines 15 in response to a row address.

Figure 2A:
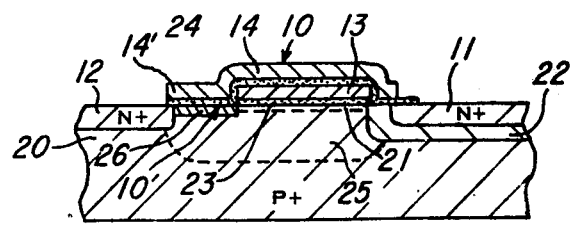
FIGS. 2a and 2b are enlarged sectional and plan views of one of the memory cells in the array of FIG. 1.
Figure 2B:
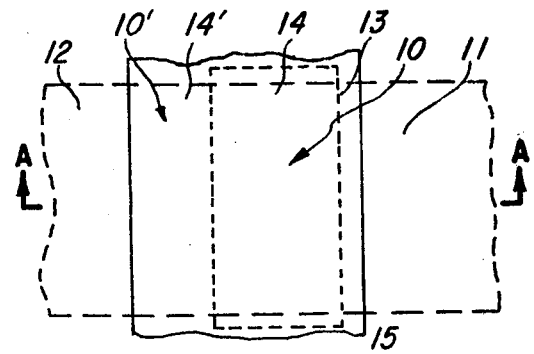

The structure of one of the cells is seen in a greatly enlarged sectional view in FIG. 2. The cell is formed in a semiconductor substrate 20 which is P-type silicon for the N-channel silicon gate MOS transistors herein described. The transistor 10 of the cell is created by a channel region 21 beneath the floating gate 13 and adjacent N-type implanted region 22 which connects to the source 11. The floating gate 13 composed of phosphorus-doped polycrystalline silicon is insulated from the underlying channel region 21 by a thermally-grown gate oxide layer 23 having a thickness of perhaps 700 to 1200 Å. The control gate 14 forms the row line 15 and is also composed of phosphorus-doped polycrystalline silicon. The control gate 15 extends beyond the edges of the floating gate 13, on one side to create the gate 14' and on the other side merely for ease in alignment. The control gate 14 is isolated from the floating gate by a thermal oxide layer 24 which is of selected thickness according to copending application Ser. No. 754,144 filed Dec. 27, 1976 by L. S. Wall, assigned to Texas Instruments. Generally, the thickness of the oxide layer 24 is about half that of prior art Ep/ROM devices which did not operate according to the principles of application Ser. No. 754,144. Depending upon a number of factors such as process variations, desired operating voltages and conditions, and the like, the layer 24 may be, for example, 600 to 1200 Å in thickness; the object is for charge to escape from the floating gate 13 to the control gate 14 when the electric field across the oxide layer 24 is high, whereas ordinarily this leakage is an undesirable condition and is avoided by making the oxide layer 24 much thicker than the gate oxide 23, for example about 2000 Å. The transistor 10' is created between the area which functions as the drain 12 of the transistor 10 and an N+ diffused region 12'; this will be an enhancement mode transistor, whereas the transistor 10 may act as a depletion device if a "0" is stored. Both transistors 10 and 10' are formed in a "P+ tank" region 25 which is an implanted region of higher boron concentration than the substrate 20, functioning to allow the floating gate to be charged at a lower voltage than would be the case if the P+ region were not employed. According to the invention, an implanted region 26, subjected to a phosphorus implant, underlies the gate 14' and lowers the threshold voltage of the enhancement transistor.

In operation of the device thus far described, the memory system has two different operating modes, one for writing or programming where high voltages (20 to 25 v) are used, and another for read or recall where standard N-channel operating voltages of perhaps 5 or 10 v. are used. Considering one of the cell transistors 10, if the source 11 is at ground or Vss, the drain 19 is at the high voltage level Vp (25 v.), the control gates 14 and 14' are at high voltage Vp as established by the row decoder 16, and the substrate 20 is at Vss, then negative charge will accumulate on the floating gate 13 due to injection of electrons through the oxide 23. This programs the device to store a "1" because the charged gate 13 shields the channel region 21 from the gate 14 so that the channel cannot be inverted even though the gate 14 has a +10 v. positive voltage thereon. To deprogram the cell, or to write a "0" into the cell, the conditions are the same except that the drain 12 is also taken to a low voltage, Vss. In this condition, charge escapes from the floating gate, so in effect, the threshold voltage of the MOS transistor is lowered. A +5 or +10 v. logic level on the gate 14 will subsequently invert the channel 21 and turn on the device. In the program or deprogram modes, the rows of cells in the array which are not addressed will have low voltage (Vss) on the gates 14; that is, the row address lines 15 will be at Vss except for the addressed row for programming or deprogramming which will be at Vp or +25 v. All of the transistors in the rows other than the addressed row will be immune to change because their control gate voltages will be low. In either programming or deprogramming, both source line 17 and drain line 18 for the non-addressed columns are taken to the high voltage level +25 v.; i.e., the lines 17 and 18 are both forced to the high level by the decoder circuitry 19 except the column addressed for programming. For the addressed column, the source line 17 is at Vss in either case, and the drain line 18 is at Vp to write a "1" or Vss to write "0."

Figure 3:
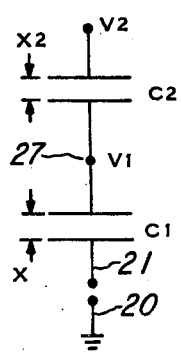
FIG. 3 is a schematic representation of the operation of the cell of FIG. 2.

The deprogramming phenomenon of the cell of the invention may be explained by assuming that the double level poly structure of FIG. 2 forms two capacitors C1 and C2 in series as seen in FIG. 3. V1 is the voltage on the floating gate 13 and V2 is the voltage on the control gate 14. If a charge Q exists on a node 27 between the two capacitors C1 and C2, then with V2 applied to the control gate 14 the voltage V1 will equal $(Q+V2C2)/(C1+C2)$, while the field E2 across the second level oxide layer 24 is $(V2-V1)/X2$. Thus E2 equals $(V2C1-Q)/X2(C1+C2)$. When the source 11 and drain 12 of a device of this type are taken to V2, the channel 21 inverts and assumes the potential V2 also. Then the field across C2 will drop to E2' which is $(-Q)/X2(C1+C2)$. Since leakage is a strong function of the electric field, when the source and drain are low and the gate is high (the electric field is E2), electrons leak between the floating gate 13 and the control gate 14 so the device "erases." But when the source and drain are high, the electric field E2' is low enough to prevent leakage.

As an example, assume a "1" is to be wupper left cell 10 in FIG. 1 (a "1" is the condition where a negative charge is on the floating gate 13). The top line 15 is taken high to Vp while the remaining address lines 15 are held low or at Vss. The left-hand source line 17 is held low at Vss while the remaining source lines 17 are high at Vp. All of the drain lines 18 are at Vp. To write "0," the exact same conditions exist, except that the left-hand drain line 18 would also be low at Vss.

Referring now to FIG. 4, a part of a cell array according to the invention is illustrated. FIGS. 5a to 5d are sectional views of the device of FIG. 4, as in FIG. 2, showing details of construction. The area shown in FIG. 4 is about 2 mils by 3 mils in size; the cell array may contain, for example, 4096 cells or other power of two such as 16384. The four transistors 10 for the cells shown are created in two parallel elongated moats 28 and 29 which are surrounded by thick field oxide on the upper face of the chip 20. N+ diffused regions 30 in the moats 28 and 29 form interconnections to the sources and drains of the transistors. Elongated parallel strips of polycrystalline silicon form the address lines 15 and the control gates 14 of the transistors. The floating gates 13 are buried beneath the strips 15. Parallel vertical metal strips form the source and drain lines 17 and 18, and these lines contact the sources at contact areas 31 and the drains at contact areas 32 where the metal, which is the top layer, extends down to make contact to N+ diffused areas of the moats 28 and 29. Each contact area is shared with an adjacent cell, so there need be on average only one contact area per cell. The metal lines 17 and 18 are insulated from the second level poly lines 15 by a thick oxide layer 33. Field oxide 34 surrounds the moats 28 and 29.

As set forth in the copending application Ser. No. 754,207, the advantage of the structure of FIGS. 1–5 with the transistors 10' in series with the floating gate devices is that the transistors 10 can be deprogrammed an excessive amount, even to depletion. Without this, the process window is quite narrow, i.e., the characteristics of the device must be within narrow limits such that the threshold voltage Vtx is returned to a low value upon deprogramming so that it can be detected, but Vtx cannot go into a depletion mode upon deprogramming. If the devices 10 went into the depletion mode upon deprogramming, addressed cells could not be distinguished from non-addressed cells. However, with the enhancement devices 10' added, the floating gate transistors 10 can go into depletion, i.e., turned on with zero volts on the control gate 14, because current flow through non-addressed cells will be prevented by the series-connected enhancement transistor 10' which will still require a standard threshold of perhaps one volt to turn on. It would also be possible to provide enhancement devices on both sides of the floating gate by eliminating the implanted region 22 entirely; however, injection of electrons is facilitated by having the N region close, so the disclosed embodiment is preferred. The injection of electrons is also enhanced by the P+ tank 25, but unfortunately this also raises the threshold voltage of the series enhancement transistor 10', up to perhaps as high as +3 or +4 volts. Such a high threshold is undesirable, particularly if a +5 v. supply is to be used instead of the traditional +12 v. Vss. It is preferred that the enhancement device 10' have a threshold of about 1 volt or 0.8 volt, and this is accomplished by the phosphorus implanted region 26, according to the invention.

Turning now to FIGS. 6a–6h, 7a–7h, and 8a–8h, a process for manufacturing the devices described above will be explained. Note that FIGS. 6a–6h correspond to the sectional view of FIG. 2 in the finished device, that is to line 2—2 in FIG. 4, while FIGS. 7a–7h correspond to the sectional view of FIG. 5d, that is to the line d—d in FIG. 4. FIGS. 8a–8h correspond to a depletion mode transistor, not in the cell array and not in FIG. 4, as would be located in the decoder circuitry 16 or 19, or in the input or output circuits for the chip.

This is basically an N-channel, silicon-gate, self-aligned double level poly process for making MOS integrated circuit devices. The starting material is a slice of P-type monocrystalline silicon, perhaps 3 inches in diameter and 30 mils thick, cut on the <100> plane, of P-type doped with boron in growing to a resistivity of about 6 to 8 ohm-cm. In FIGS. 4–8, portions shown are only one or two mils wide and represent very small parts of the slice, chosen as representative sample cross sections. First, after appropriate cleaning, the slice is oxidized by exposing to oxygen in a furnace at an elevated temperature of perhaps 1000° or 1100° C. to produce an oxide layer 41 of a thickness of about 1000 Å. Next, a layer 42 of silicon nitride $Si_3N_4$ about 1000 Å thick is formed by exposing to an atmosphere of silane and ammonia in an rf reactor. A coating 43 of photoresist is applied to the entire top surface, then exposed to ultraviolet light through a mask which defines the desired pattern, and developed. This leaves areas 44 where nitride is to be etched away; these are the areas where field oxide 34 is to be grown. The slice is subjected to a plasma etch, which removes the part of the nitride layer 42 not covered by the exposed photoresist 43, but does not remove the oxide layer 41 and does not react with the photoresist 43.

As seen in FIGS. 6b, 7b and 8b, another coating 44 of photoresist is patterned to cover areas wider than what will be the moats. The purpose of this is to prevent channel stop P+ regions from being in contact with N+ regions because low breakdown would result at P+ to N+ junctions.

The slice is now subjected to an ion implant step, preferably using another oversized moat mask, whereby boron atoms are implanted in the areas 45 of silicon not covered by photoresist 43 and 44 which masks the implant. Boron is an impurity which produces P-type conductivity, so more heavily doped P+ regions 46 will be produced in the surface. The oxide layer 41 is left in place during the implant because it prevents the implanted boron atoms from out-diffusing from the surface during subsequent heat treatment. The boron implant is at a dosage of about $4 \times 10^{13}/cm^2$ at 100 KeV. After the implant, the photoresist layers 43 and 44 are removed.

As will be seen, the regions 46 do not exist in the same form in the finished device, because some of this part of the slice will have been consumed in the oxidation procedure. The implanted regions 46 will ultimately produce the P+ channel stop regions. Because of the oversized moat mask, the channel stop regions do not touch the channels or N+ regions.

Turning now to FIGS. 6c, 7c, 8c, the P+ tank implant step is illustrated. A coating 47 of photoresist is applied, then patterned to expose only areas 48 in the cell array which are about the width of the second level poly. Then the slice is subjected to a boron implant step at a dosage of perhaps $7 \times 10^{12}$ at 100 KeV to produce implanted regions 49.

As set forth in patent application Ser. No. 684,593, filed Jan. 12, 1975, by G. R. Mohan Rao, assigned to Texas Instruments, the next step in the process is to subject the slice to a heat treatment or annealling step, during which the slice is maintained at a temperature of about 1000° C. for perhaps approximately 2 hours in an inert atmosphere, preferably nitrogen. This step causes the boron concentration to change and reduces bulk damage in the crystal structure caused by the implant. The P+ regions 46 and 47 will have penetrated deeper into the silicon surface after the anneal step.

The following step in the process is formation of field oxide, which is done by subjecting the slices to steam or an oxidizing atmosphere at about 900° C. for perhaps 20 hours. As seen in FIGS. 6d, 7d and 8d, this causes a thick field oxide layer 34 to be grown, and this layer extends into the silicon surface because silicon is consumed as it oxidizes. The nitride layer 42 masks oxidation beneath it. The thickness of this layer 34 is about 8000 to 10,000 Å, half of which is above the original surface and half below. The boron doped P+ regions 46 as previously implanted and modified by the anneal step, will be partly consumed, but boron will also diffuse further into the silicon ahead of the oxidation front. Thus, P+ channel stop regions 50 will result which will be deeper and of more uniform and acceptable concentration at the surface compared to what would have resulted without the anneal step. Also, the regions 50 will not have the extent of crystalline structure damage characteristic of implanted devices.

The nitride layer 42 and its underlying oxide layer 41 are removed by etching, as the next step, and another thin silicon oxide layer 23 of about 800 Å is grown over the exposed areas of silicon. Windows for first level polysilicon to substrate contacts (none seen in these views) are patterned and etched using photoresist, removing the gate oxide layer 23 in selected areas. Next, a layer of polycrystalline silicon is deposited over the entire slice in a reactor using standard techniques, for example by decomposition of silane in hydrogen at about 930° C. to a thickness of about 6000 Å, producing the polysilicon which will ultimately form the floating gates 13. The layer of poly is subjected to a phosphorus implant or diffusion to render it conductive. The diffusion would not penetrate the substrate 20 except at the poly to silicon contact areas (not shown).

Referring to FIGS. 6d, 7d, and 8d, the polysilicon coating and the underlying gate oxide or thin oxide layer 23 are next patterned. This is done by applying a layer of photoresist, exposing to ultraviolet light through a mask prepared for this purpose, developing, then etching with the remaining photoresist masking certain areas of the polysilicon. The resulting structure is seen in these figures, where a part of the remaining polysilicon layer provides what will be the floating gate 13 of one of the transistors 10.

The slice is next subjected to a phosphorus implant which will create the lightly doped implanted N-regions 22. A photoresist mask step covers areas where implant is not wanted, if necessary. This implant is aligned with the first level poly and underlying oxide 23.

After patterning the polysilicon to provide the floating gates 13 and the implant for the regions 22, the layer 24 of silicon dioxide is grown on the polysilicon and silicon, producing a coating on all exposed surfaces of the poly, as seen in FIGS. 6e, 7e, and 8e, including tops and sides. The layer 24 is grown at about 1100° C. in oxygen for about ½ hour, producing approximately 1200 Å thickness and consuming part of the polysilicon. If second level poly to silicon contacts are needed, contact areas would be opened at this point.

The high temperature operation grows the oxide 24 and also drives the implanted phosphorous into the silicon to produce the N-regions 22 at their proper depth. The mask used for the N-implant is the photoresist 51 seen in FIG. 6a; for the $V_t$ adjust implant according to the invention, another photoresist implant mask is not needed as it will not overcome the N-implant. This $V_t$ implant is at a dosage of about $1 \times 10^{13}/cm^2$ at 100 KeV and produces the shallow region 26 seen in FIG. 6f, lowering the threshold for the senses enhancement device 10'.

The second level polysilicon is next deposited over the entire top surface of the slice over the oxide layer 24, using a reaction as above, to provide the control gates 14 and strips 15. The second level poly is patterned using photoresist to define the strips 15, and the oxide layer 24 is etched away in all areas except under the strips 15. A deposition and diffusion operation now produces the heavily doped N+ source and drain regions 11 and 12 as well as the regions 30 in the moats 26 and 27 and the N+ regions under the contact areas 31 and 32.

Using the remaining polysilicon strips 15 and thin oxide 24 as a diffusion mask, the slice is now subjected to an N+ diffusion, whereby phosphorus is deposited and then diffused into the silicon slice 20 to produce the N+ source and drain regions 11 and 12' as well as the regions 30 in the moats 28 and 29 and the N+ regions under the contact areas 31 and 32, as seen in FIGS. 6g, 7g, and 8g. The depth of diffusion is about 8000 to 10,000 Å. The N+ diffused regions function as conductors which connect the various regions together, and also function as the source or drain regions. This diffusion also heavily dopes all the exposed polysilicon areas such as the control gates 14 and 14' and lines 15.

As seen in FIGS. 6h, 7h, 8h, fabrication of the device is continued by depositing a layer 33 of phosphorus-doped oxide. Rather than by oxidizing, this is done by a low temperature reaction process using conventional chemical vapor deposition techniques. A layer 33 of about 1000 Å is produced, covering the entire slice. This deposition is followed by a "densification" step wherein the slice is heated at 950° C. for the purpose of eliminating minute holes or pores in the oxide. Subsequently, a photoresist operation opens windows in the oxide layer 33 in areas 31 and 32 where contact is to be made from metal to the moat or from metal to the polysilicon layer (none seen in the illustrative embodiment). Then, a layer of aluminum is deposited on the entire slice, and etched away using photoresist masking to provide the desired pattern of metal interconnections 17 and 18.

The series-connected enhancement mode transistor 10' with Vt adjusted according to the invention may also be used in a block-erasable array as described in my copending application Ser. No. 754,145, filed Dec. 27, 1976, assigned to Texas Instruments Incorporated. This embodiment is shown in schematic in FIG. 9 and in layout in FIG. 10, as well as in section in FIG. 11. In these figures, all elements having the same reference numerals are the same as in the previous embodiment. The difference is that all of the source electrodes 11 in a block of cells are connected in common to a drain column line 18; the "source" and "drain" terminals are switched for programming, that is, the source 11 becomes the "drain" and the drain 12 becomes the "source." The series enhancement transistor 10' is interposed as before. Operation is the same except that for the programming mode, for the addressed column, the source line 17 is at Vp and the drain line 18 is at Vss to write a "1" (opposite from the first embodiment).

In the erasable ROM device of my above-mentioned application Ser. No. 754,144, filed Dec. 27, 1976, it was concluded that the sources need to be decoupled from one another in order to avoid field emission deprogramming while an adjacent bit was being programmed. In a block erasable array as in FIGS. 9-10, this phenomenon is of no concern; inadvertant deprogramming is avoided without decoupling the sources. The array of the invention is useful not only in electrically alterable ROM's but also in electrically programmable (UV erasable) type devices that must use a thin oxide layer 24 for higher gain. Some possible examples are 5 v. devices, combined PROM/RAM designs, or PROM/microprocessor combinations.

Figure 9:
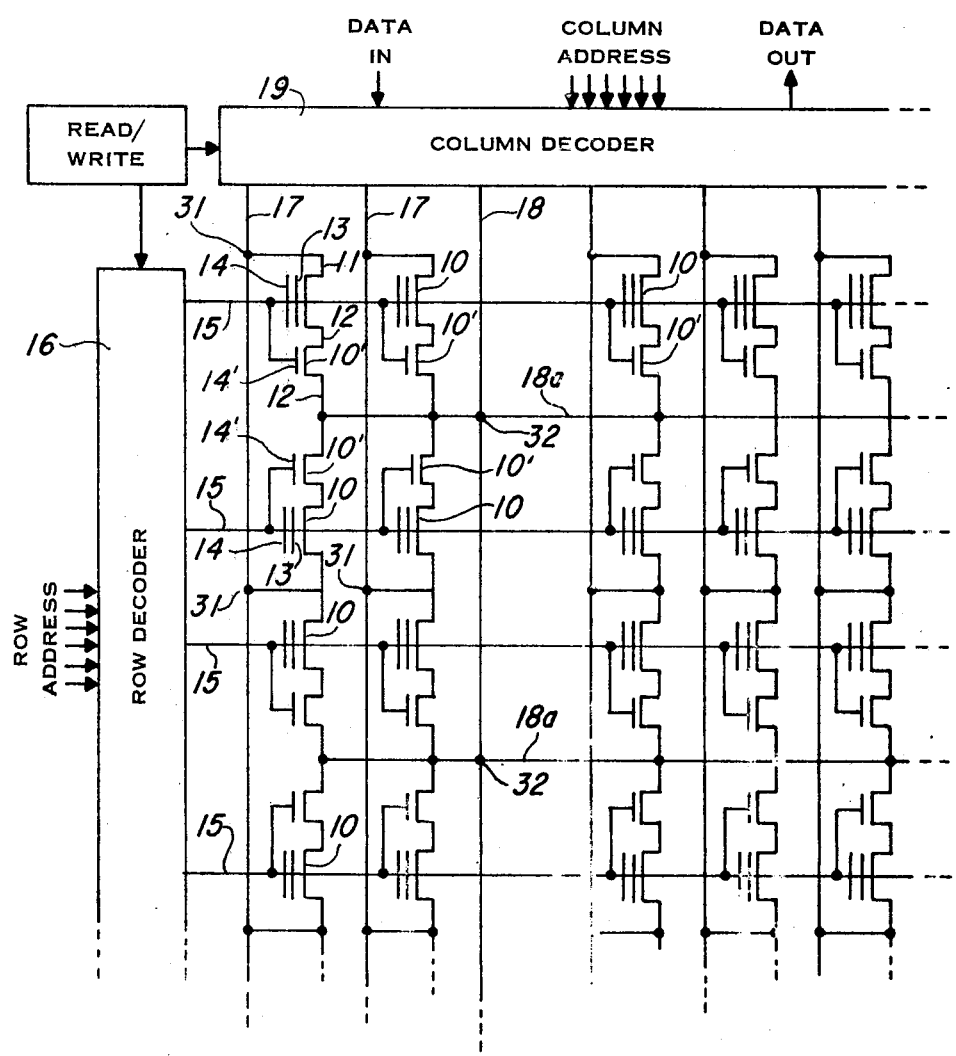
FIGS. 9, 10 and 11 are schematic, plan and sectional views of another embodiment of the invention.
Figure 10:
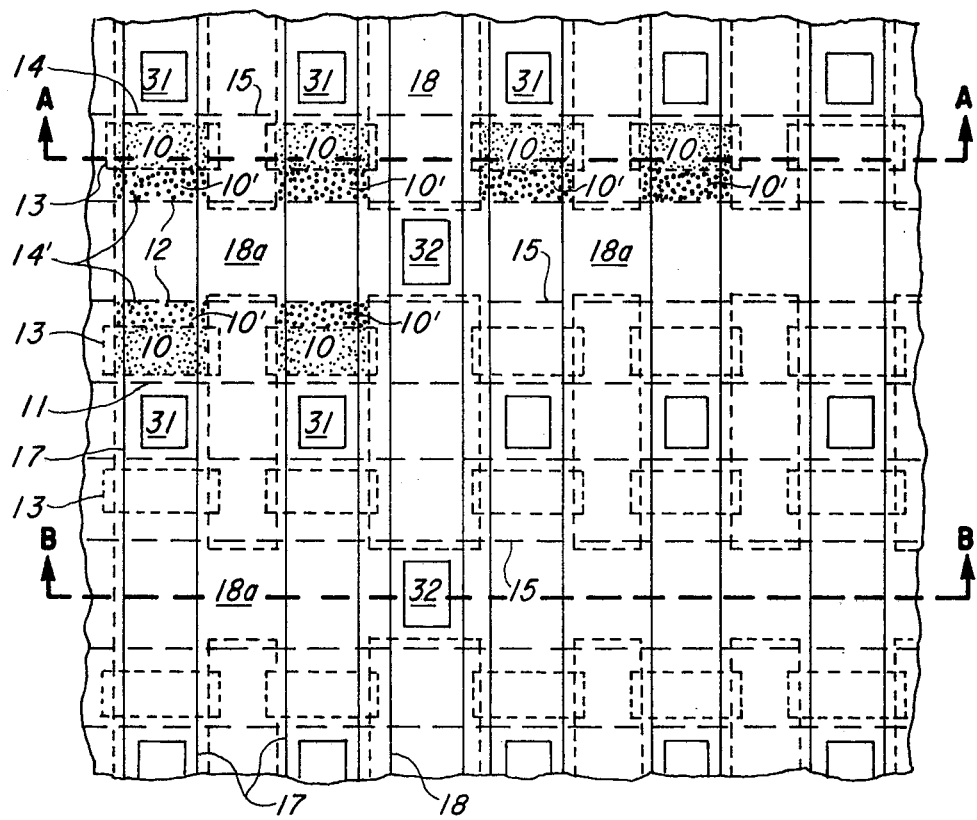
Figure 11A:
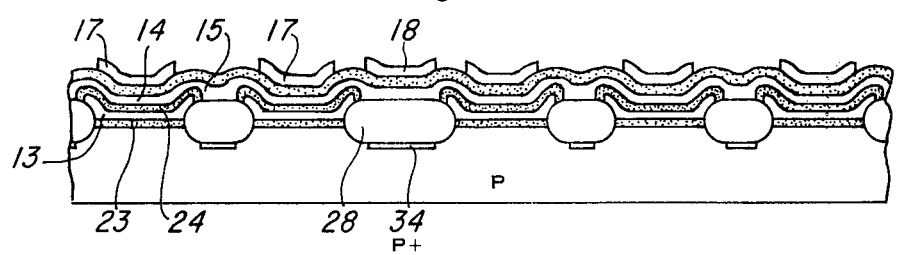
Figure 11B:
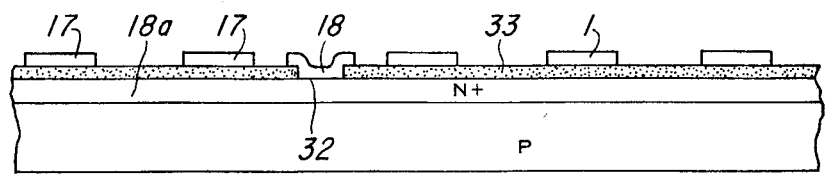

In the array of FIGS. 9–11, a primary feature is that the transistors 10 are turned around for programming, using the drains as sources and the sources as drains. Assume the bit 10a of FIG. 10 is to be programmed: the common sources are taken to Vp via lines 17 and 17a and contact 31 (all sources in the block will be high). The drains of transistors 10a and 10b (and all in this column) are taken to Vss, while all of the other drains, such as for transistors 10c and 10d, are taken to Vp. The line 15 over transistors 10a and 10c is taken to Vp, and all other second level poly lines 15, such as the one over transistors 10b and 10d, is taken to Vss. Under these conditions, the floating gate 13 for the transistor 10a is charged, because its source is at Vp and its drain at Vss and gate at Vp; none of the other transistors are affected—transistor 10c has gate as well as source and drain at Vp, transistor 10d has source and drain at Vp and gate at Vss. The substrate is always at Vss.

To deprogram or erase the array, all gate lines 15 are taken to Vp and all lines 17 and 18 to Vss. Also, one row line 15 at a time can be erased.

To read out, one of the row lines is selected by the row address decoder 16 to have a "1" logic level or Vdd voltage thereon, the others are at Vss. All sources are connected to Vss via lines 17 by the column decoder 19, and one of the drain column lines 18 is selected by the column decoder to be connected to Vdd through a load impedance, all other lines 18 being ignored. Thus, only one transistor 10 is read out.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An electrically programmable, nonvolatile, floating gate, semiconductor memory array comprising: a plurality of cells arranged in an array of rows and columns; each cell in the array having a first MOS transistor device with a source, a drain, a floating gate, and a control gate, each first transistor device having a first threshold voltage when programmed at one logic level and a second higher threshold when programmed at another logic level; each cell in the array having a second MOS transistor device, the second MOS transistor in each cell having a source which is integral with the drain of the first MOS transistor device in such cell and a gate which is connected to the control gate of the first MOS transistor device in such cell, each second MOS transistor device having a drain, each second MOS transistor device having an impurity concentration in a channel under its gate which differs from the impurity concentration in a channel under said floating gate whereby the second MOS transistor exhibits a threshold substantially lower than said first threshold voltage; means for connecting the control gates of all of the first MOS transistor devices in each row together to provide row lines; means connecting said sources of all of the first MOS transistor devices in each of the columns separately to first column lines; means connecting said drains of all of the second MOS transistor devices in each of the columns separately to second column lines; programming means including means for selecting one of the row lines and applying a high voltage to it while applying a low voltage to the remaining row lines, and means for selectively connecting the first and second column lines to low voltage or high voltage supplies.

2. A memory array according to claim 1 wherein the first and second MOS transistor devices are N-channel and the floating gate and control gate are polycrystalline silicon.

3. A memory array according to claim 2 wherein means are provided for reading data from the array by applying a voltage less than said high voltage to a selected one of the row lines and grounding a selected one of the first column lines.

4. A memory array according to claim 3 wherein a thin insulator between the floating gate and control gate in each of the first MOS transistor devices permits the floating gate to discharge when the source and drain are grounded and the control gate is at a high voltage.

5. A memory array according to claim 4 wherein the threshold of the second transistors is altered by an implanted region beneath the gate thereof.

6. An electrically programmable, nonvolatile, floating gate, semiconductor memory cell comprising: a first MOS transistor having a source, a drain, a floating gate, and a control gate; a second MOS transistor having a source, a gate and a drain, said source of said second MOS transistor being integral with said drain of the first MOS transistor, and said gate of said second MOS transistor being integral with said control gate of said first MOS transistor; an insulating layer separating the floating gate and the control gate of said first MOS transistor; a gate insulator separating the floating gate from a channel region between the source and drain of the first MOS transistor; means for selectively applying high voltage to said control gate while applying reference potential to the source of the first MOS transistor and high voltage to the drain of the second MOS transistor to program the cell by charging the floating gate via electrons traversing the gate insulator; means for selectively applying high voltage to the control gate while applying high voltage to the source of the first MOS transistor and the drain of the second MOS transistor to deprogram the cell by charge traversing the insulating layer; said second MOS transistor having an impurity concentration in a channel under its gate which differs from the impurity concentration in a channel under the floating gate whereby the second MOS transistor exhibits a threshold voltage much less than the threshold voltage of said first transistor when said floating gate is not charged.

7. In a memory cell according to claim 6, the first and second MOS transistors being N-channel transistors formed in a P-channel substrate, an implanted P+ region being provided beneath the floating gate and control gate to enhance programming the cell by electrons traversing the gate insulator, and an implanted surface region within the P+ region between the source and drain of the second MOS transistor to lower the threshold voltage thereof.

8. A memory cell according to claim 7 wherein the control gate is integral with the gate of the second MOS transistor.

9. A memory cell according to claim 8 wherein the floating gate and control gate are polycrystalline silicon.

10. A memory cell according to claim 9 wherein the insulating layer is thermall-grown silicon dioxide.

11. A memory cell according to claim 10 wherein the insulating layer is not more than about 150% as thick as the gate insulator.

* * * * *